US009543010B2

(12) United States Patent
Lin et al.

(10) Patent No.: US 9,543,010 B2
(45) Date of Patent: Jan. 10, 2017

(54) RESISTIVE MEMORY AND MEASUREMENT SYSTEM THEREOF

(71) Applicant: WINBOND ELECTRONICS CORP., Taichung (TW)

(72) Inventors: Lih-Wei Lin, Hsinchu (TW); Chia-Hung Lin, Taichung (TW); Tsung-Huan Tsai, Taichung (TW); Ju-Chieh Cheng, Hemei Township, Changhua County (TW); I-Hsien Tseng, Zhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/019,187

(22) Filed: Feb. 9, 2016

(65) Prior Publication Data
US 2016/0240268 A1 Aug. 18, 2016

(30) Foreign Application Priority Data
Feb. 16, 2015 (TW) .............................. 104105250 A

(51) Int. Cl.
*G11C 11/00* (2006.01)
*G11C 13/00* (2006.01)
*G11C 29/50* (2006.01)

(52) U.S. Cl.
CPC ..... *G11C 13/0069* (2013.01); *G11C 29/50008* (2013.01); *G11C 2029/5006* (2013.01)

(58) Field of Classification Search
USPC .......................................... 365/148, 201, 200
See application file for complete search history.

(56) References Cited

U.S. PATENT DOCUMENTS

| 8,848,421 B2 * | 9/2014 | Kawai | G11C 13/0007 365/148 |
| 2015/0371705 A1 * | 12/2015 | Onkaraiah | G11C 13/0007 327/208 |

OTHER PUBLICATIONS

U.S. Appl. No. 15/244,308, Aug. 23, 2016.

* cited by examiner

*Primary Examiner* — Vu Le
(74) *Attorney, Agent, or Firm* — Muncy, Geissler, Olds & Lowe, P.C.

(57) ABSTRACT

A measurement system including a testing machine and a resistive memory is provided. The resistive memory includes a first storage cell. The first storage cell includes a transistor and a variable resistor. During a specific period, the testing machine provides a write voltage to change the state of the variable resistor. During a maintaining period, the testing machine maintains the level of the write voltage and measures the current passing through the variable resistor. When the current passing through the variable resistor does not arrive at a pre-determined value, the testing machine increases the level of the write voltage. Furthermore, a resistive memory utilizing the testing machine is also provided.

10 Claims, 4 Drawing Sheets

RESISTIVE MEMORY AND MEASUREMENT SYSTEM THEREOF

CROSS REFERENCE TO RELATED APPLICATIONS

This application claims priority of Taiwan Patent Application No. 104105250, filed on Feb. 16, 2015, the entirety of which is incorporated by reference herein.

BACKGROUND OF THE INVENTION

Field of the Invention

The invention relates to a non-volatile memory, and more particularly to a resistive memory and a measurement system thereof.

Description of the Related Art

Generally, memory units used in computers comprise volatile memories and non-volatile memories. The non-volatile memories comprise read-only memories (ROMs), programmable read-only memories (PROMs), erasable programmable read-only memories (EPROMs), and flash memories. The volatile memories comprise dynamic random access memories (DRAMs) and static random access memories (SRAMs).

New kinds of volatile memory comprise ferroelectric memory, Phase-change memory, Magnetoresistive Random Access Memory (MRAM) and Resistive Random Access Memory (RRAM). The RRAMs are used widely, as they possess such favorable advantages as having a simple structure, low cost, high speed, and low power consumption.

BRIEF SUMMARY OF THE INVENTION

In accordance with an embodiment, a measurement system comprises a testing machine and a resistive memory. The testing machine provides a row address, a column address, a word voltage, a bit voltage and a source voltage. The resistive memory comprises a row controller, a column controller, and a first storage cell. The row controller is coupled to a plurality of word lines and transmits the word voltage to a first word line among the word lines according to the row address. The column controller is coupled to a plurality of bit lines and transmits the bit voltage to a first bit line among the bit lines according to the column address. The first storage cell comprises at least one transistor and at least one variable resistor. A gate of the transistor is coupled to the first word line. A source of the transistor is coupled to a source line. The variable resistor is couple between the first bit line and a drain of the transistor. The source line receives the source voltage. In a specific period, the testing machine provides a write voltage to change the state of the variable resistor. The testing machine maintains the level of the write voltage and measures the current flowing through the variable resistor in a maintaining period. When the current flowing through the variable resistor does not arrive at a pre-determined value, the testing machine increases the write voltage.

In accordance with another embodiment, a resistive memory receives a row address, a column address, a word voltage, a bit voltage, and a source voltage and comprises a row controller, a column controller, and a first storage cell. The row controller is coupled to a plurality of word lines and transmits the word voltage to a first word line among the word lines according to the row address. The column controller is coupled to a plurality of bit line and transmits the bit voltage to a first bit line among the bit lines according to the column address. The first storage cell comprises at least one transistor and at least one variable resistor. A gate of the transistor is coupled to the first word line. A source of the transistor is coupled to a source line. The variable resistor is coupled between the first bit line and a drain of the transistor. The source line receives the source voltage. In a specific period, the resistive memory receives a write voltage to change the state of the variable resistor. The level of the write voltage is maintained in a maintaining period. When the current flowing through the variable resistor does not arrive at a pre-determined value, the level of the write voltage received by the resistive memory is increased.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
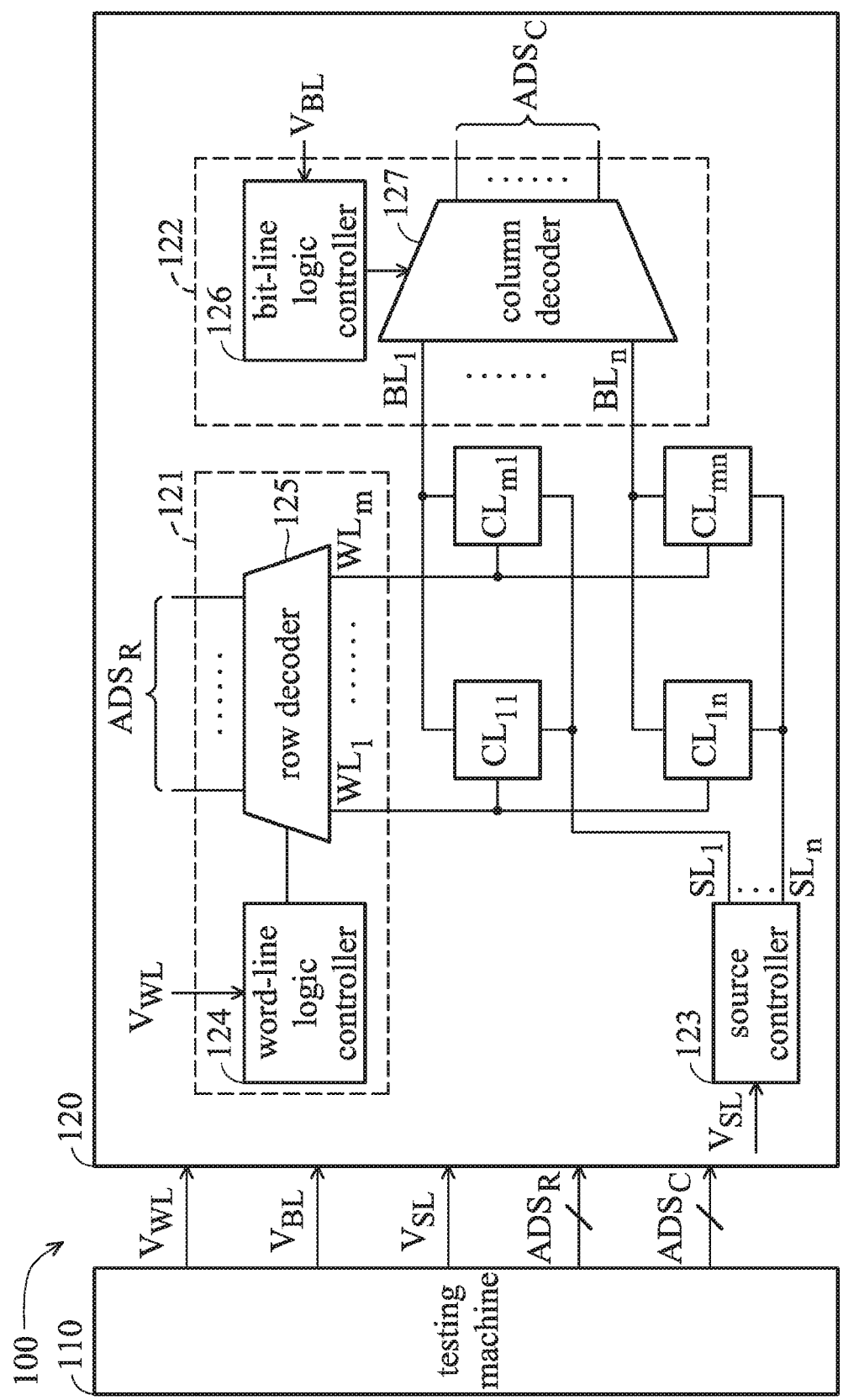
FIG. 1 is a schematic diagram of an exemplary embodiment of a measurement system, according to various aspects of the present disclosure.

FIG. 1 is a schematic diagram of an exemplary embodiment of a measurement system, according to various aspects of the present disclosure. The measurement system 100 comprises a testing machine 110 and a resistive RAM (RRAM) 120. The testing machine 110 is configured to determine whether the resistive RAM 120 can access data normally. In this embodiment, the testing machine 110 provides a word voltage $V_{WL}$, a bit voltage $V_{BL}$, a source voltage $V_{SL}$, a row address $ADS_R$ and a column address $ADS_C$. In one embodiment, the row address $ADS_R$ and the column address $ADS_C$ are parallel data.

The resistive RAM 120 comprises a row controller 121, a column controller 122, a source controller 123, and storage cells $CL_{11}$~$CL_{mn}$. The row controller 121 is coupled to the bit lines $WL_1$~$WL_m$ and transmits the word voltage $V_{WL}$ to one of the bit lines $WL_1$~$WL_m$. In other embodiments, the row controller 121 can provide the word voltage $V_{WL}$ to 2 or more bit lines.

In this embodiment, the row controller 121 comprises a word-line logic controller 124 and a row decoder 125. The word-line logic controller 124 receives the word voltage $V_{WL}$ and provides the word voltage $V_{WL}$ to the row decoder 125. The row decoder 125 decodes the row address $ADS_R$ and outputs the word voltage $V_{WL}$ to at least one of the bit lines $WL_1$~$WL_m$ according the decoded result. Furthermore, the column controller 122 is coupled to the bit lines $BL_1$~$BL_n$ and transmits the bit voltage $V_{BL}$ to one of the bit lines $BL_1$~$BL_n$ according to the column address $ADS_C$. In other embodiments, the column controller 122 may provide the bit voltage $V_{BL}$ to 2 or more bit lines. In this embodiment, the column controller 122 comprises a bit-line logic controller 126 and a column decoder 127. The bit-line logic controller 125 receives the bit voltage $V_{BL}$ and provides the bit voltage $V_{BL}$ to the column decoder 127. The column decoder 127 decodes the column address $ADS_C$ and outputs the bit voltage $V_{BL}$ to at least of the bit lines $BL_1$~$BL_n$ according to the decoded result.

Each of the storage cells $CL_{11}$~$CL_{mn}$ is coupled to a corresponding word line, a corresponding bit line, and a corresponding source line to receive the word voltage $V_{WL}$, the bit voltage $V_{BL}$, and the source voltage $V_{SL}$. Taking the storage cell $CL_{11}$ as an example, the storage cell $CL_{11}$ is coupled to the word line $WL_1$, the bit line $BL_1$, and the source line $SL_1$. In another embodiment, the word line $WL_1$ comprises two sub-word lines (not shown), and the bit line $BL_1$ may comprise two sub-bit lines (not shown). Therefore, the storage cell $CL_{11}$ may be coupled to two sub-word lines and/or two sub-bit lines.

In this embodiment, the storage cells, such as $CL_{11}$~$CL_{mn}$ arranged in the same row are coupled to the same source line. For example, the storage cells $CL_{11}$~$CL_{mi}$ are coupled to the source line $SL_1$, and the storage cells $CL_{1n}$~$CL_{mn}$ are coupled to the source line $SL_n$. In some embodiments, different storage cells are coupled to different source lines. The invention does not limit the arrangement of the storage cells. In one embodiment, the storage cells $CL_{11}$~$CL_{mn}$ are arranged in an array. In particular, the source controller 123 receives the source voltage $V_{SL}$ and provides the source voltage $V_{SL}$ to the source lines $SL_1$~$SL_n$. In this embodiment, the source controller 123 provides the source voltage $V_{SL}$ to the storage cells $CL_{11}$~$CL_{mn}$ via the source lines $SL_1$~$SL_n$. In some embodiments, the source controller 123 only utilizes a single source line to provide the source voltage $V_{SL}$ to the storage cells $CL_{11}$~$CL_{mn}$.

Figure 2A:
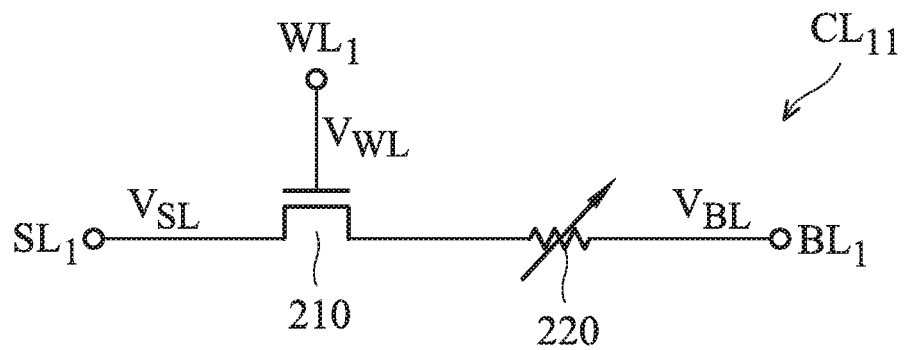
FIGS. 2A and 2B are schematic diagrams of exemplary embodiments of a storage cell, according to various aspects of the present disclosure.

FIG. 2A is a schematic diagram of an exemplary embodiment of a storage cell, according to various aspects of the present disclosure. Since the structures of the storage cells $CL_{11}$~$CL_{mn}$ are the same, the storage cell $CL_{11}$ is given as an example. As shown in FIG. 2A, the storage cell $CL_{11}$ comprises a transistor 210 and a variable resistor 220. The storage cell $CL_{11}$ operates at a high resistance state (HRS) or at a low resistance state (LRS) according to the word voltage $V_{WL}$, the bit voltage $V_{BL}$, and the source voltage $V_{SL}$ to represent that the storage cell $CL_{11}$ stores data "0" or data "1". The gate of the transistor 210 is coupled to the word line $WL_1$ to receive the word voltage $V_{WL}$. The source of the transistor 210 is coupled to the source line $SL_1$ to receive the source voltage $V_{SL}$. The variable resistor 220 is coupled between the bit line $BL_1$ and the drain of the transistor 210 and receives the bit voltage $V_{BL}$. The testing machine 110 controls the word voltage $V_{WL}$, the bit voltage $V_{BL}$, and the source voltage $V_{SL}$ to control the state of the variable resistor 220.

Figure 2B:
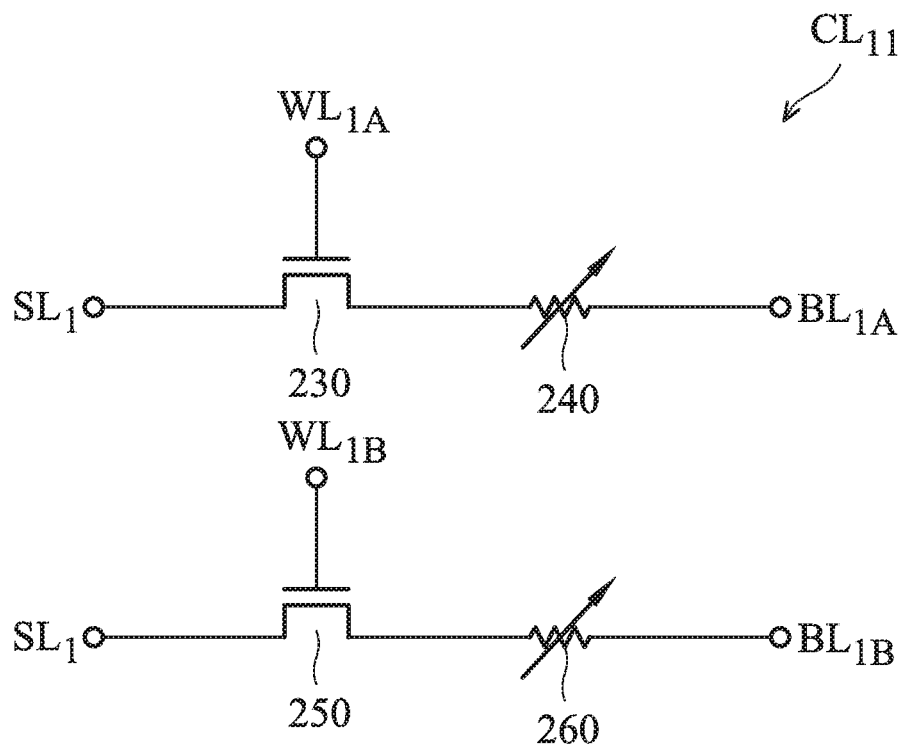

FIG. 2B is a schematic diagram of another exemplary embodiment of the storage cell, according to various aspects of the present disclosure. The storage cell $CL_1$ shown in FIG. 2B comprises transistors 230 and 250 and variable resistors 240 and 260. The gate of the transistor 230 is coupled to the word line $WL_{1A}$. The source of the transistor 230 is coupled to the source line $SL_1$. The variable resistor 240 is coupled between the drain of the transistor 230 and the bit line $BL_{1A}$. The gate of the transistor 250 is coupled to the word line $WL_{1B}$. The source of the transistor 250 is coupled to the source line $SL_1$. The variable resistor 260 is coupled between the drain of the transistor 250 and the bit line $BL_{1B}$.

In FIG. 2, the transistors 230 and 250 are coupled to the same source line $SL_1$, but the disclosure is not limited thereto. In another embodiment, the transistors 230 and 250 are coupled to different source lines. In some embodiments, the variable resistors 240 and 260 are coupled to the same bit line. In this embodiment, the testing machine 110 controls the voltage levels of the word lines $WL_{1A}$ and $WL_{1B}$, the bit lines $BL_{1A}$ and $BL_{1B}$, and the source line $SL_1$ to control the state of the variable resistors 240 and 260 such that the storage cell $CL_{11}$ stores the corresponding data.

For example, when the variable resistor 240 is at a LRS and the variable resistor 260 is at a HRS, it means that the storage cell $CL_{11}$ stores data "0" or data "1". When the variable resistor 240 is at the HRS and the variable resistor 260 is at the LRS, it means that the storage cell $CL_{11}$ stores the data "1" or the data "0". In another embodiment, when the variable resistors 240 and 260 are at the LRS, it means that the storage cell $CL_{11}$ stores the data "0" or the data "1". When the variable resistors 240 and 260 are at the HRS, it means that the storage cell $CL_{11}$ stores the data "1" or the data "0".

In this embodiment, the testing machine 110 provides a write voltage to change the state of the variable resistor 220 in a specific period and maintains the write voltage to measure the current flowing through the variable resistor 220 in a maintaining period. When the current flowing through the variable resistor 220 is less than a pre-determined value, the testing machine 110 increases the write voltage and provides the increased write voltage to the storage cell $CL_{11}$.

The invention does not limit the specific period. In one embodiment, the specific period is a forming period, a reset period, or a set period. When the specific period is the forming period, the testing machine 110 utilizes the word voltage $V_{WL}$, the bit voltage $V_{BL}$, and the source voltage $V_{SL}$ to set the state of the variable resistor 220 at a LRS. During this period, the bit voltage $V_{BL}$ is higher than the source voltage $V_{SL}$. When the testing machine 110 tests the storage cell $CL_{11}$ in the forming period, the write voltage is the bit voltage $V_{BL}$. The testing machine 110 increases the bit voltage $V_{BL}$ and measures the current flowing through the variable resistor 220.

When the specific period is the reset period, the testing machine 110 similarly utilizes the word voltage $V_{WL}$, the bit voltage $V_{BL}$, and the source voltage $V_{SL}$ to set the state of the variable resistor 220 from the LRS to a HRS. During this period, the bit voltage $V_{BL}$ is less than the source voltage $V_{SL}$. When the testing machine 110 tests the storage cell $CL_{11}$ in the reset period, the write voltage is the source voltage $V_{SL}$. The testing machine 110 increases the source voltage $V_{SL}$ and measures the current flowing through the variable resistor 220.

When the specific period is the set period, the testing machine 110 utilizes the word voltage $V_{WL}$, the bit voltage $V_{BL}$, and the source voltage $V_{SL}$ to set the state of the variable resistor 220 from the HRS to the LRS. During this period, the bit voltage $V_{BL}$ is higher than the source voltage $V_{SL}$. When the testing machine 110 tests the storage cell $CL_{11}$ in the set period, the write voltage is the bit voltage $V_{BL}$. The testing machine 110 increases the bit voltage $V_{BL}$ and measures the current flowing through the variable resistor 220.

Figure 3:
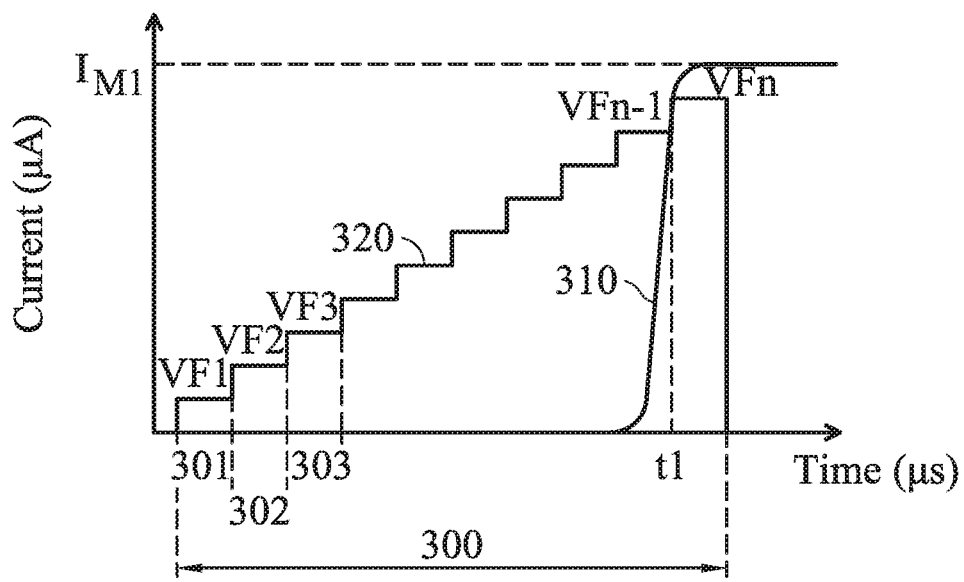
FIG. 3 is a schematic diagram illustrating the relationship between a bit voltage and the current flowing through a variable resistor when a specific period is a forming period.

FIG. 3 is a schematic diagram illustrating the relationship between the bit voltage $V_{BL}$ and the current flowing through the variable resistor 220 when the specific period is the forming period. The curve 310 represents the current flowing through the variable resistor 220. The curve 320 represents the level of the bit voltage $V_{BL}$. The testing machine 110 stepwise adjusts the bit voltage $V_{BL}$ of the bit line $BL_1$ in the forming period 300 to change the state of the variable resistor 220. At this time, the testing machine 110 maintains the level of the source voltage $V_{SL}$ and provides a forming voltage to serve as the word voltage $V_{WL}$.

In this embodiment, the testing machine 110 provides the bit voltage $V_{BL}$ to the storage cell $CL_{11}$. The testing machine 110 maintains the level of the bit voltage $V_{BL}$ and measures the current flowing through the variable resistor 220. When the current flowing through the variable resistor 220 does not arrive at a pre-determined value $I_{M1}$, the testing machine 110 increases the level of the bit voltage $V_{BL}$ until the current flowing through the variable resistor 220 arrives at the pre-determined value $I_{M1}$.

For example, the testing machine 110 sets the bit voltage $V_{BL}$ at the level VF1 and measures the current flowing through the variable resistor 220. Since the current flowing through the variable resistor 220 is less than the pre-determined value $I_{M1}$, the testing machine 110 increases the level of the bit voltage $V_{BL}$. In this embodiment, the testing machine 110 increases the level of the bit voltage $V_{BL}$ from the level VF1 to the level VF2 and maintains the bit voltage $V_{BL}$ at the level VF2 in the maintaining period 302. Next, the testing machine 110 measures the current flowing through the variable resistor 220 again. Since the current flowing through the variable resistor 220 is still less than the pre-determined value $I_{M1}$, the testing machine 110 increases the level of the bit voltage $V_{BL}$ again until the current flowing through the variable resistor 220 is higher than the pre-determined value $I_{M1}$. As shown in FIG. 3, when the bit voltage $V_{BL}$ is at the level VFn, the current flowing through the variable resistor 220 is higher than the pre-determined value $I_{M1}$. Therefore, the testing machine 110 stops providing the bit voltage $V_{BL}$. In other embodiments, when the current flowing through the variable resistor 220 is higher than the pre-determined value $I_{M1}$, the testing machine 110 maintains the level of the bit voltage $V_{BL}$ at a fixed level, such as VFn.

The invention does not limit the relationship between the maintaining periods 301~303. In one embodiment, the durations of the maintaining periods 301~303 are the same. In another embodiment, the durations of the maintaining periods 301~303 are gradually increased. For example, the duration of the maintaining period 301 is less than the duration of the maintaining period 302, and the duration of the maintaining period 302 is less than the duration of the maintaining period 303. In other embodiments, the difference between the levels VF1 and VF2 is equal to or less than the difference between the levels VF2 and VF3.

As shown in FIG. 3, before time point t1, since the variable resistor 220 is not at the LRS yet, the current flowing through the variable resistor 220 is approximately 0. Therefore, the testing machine 110 gradually increases the bit voltage $V_{BL}$. At time point t1, since the variable resistor 220 is at the LRS, the current flowing through the variable resistor 220 is quickly increased to the pre-determined value $I_{M1}$. In this embodiment, the current flowing through the variable resistor 220 does not linearly increase as the bit voltage $V_{BL}$ increases. The current flowing through the variable resistor 220 suddenly increases when the variable resistor 220 is at the LRS, such as time point t1.

Figure 4:
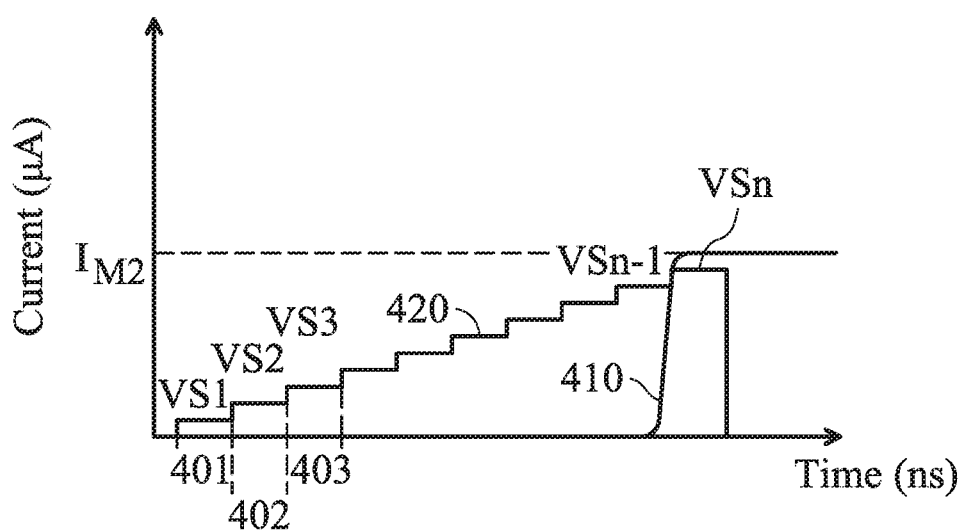
FIG. 4 is a schematic diagram illustrating the relationship between a bit voltage and the current flowing through a variable resistor when a specific period is a set period.

FIG. 4 is a schematic diagram illustrating the relationship between the bit voltage $V_{BL}$ and the current flowing through the variable resistor 220 when the specific period is the set period. The curve 410 represents the current flowing through the variable resistor 220. The curve 420 represents the level of the bit voltage $V_{BL}$. In one embodiment, the maintaining periods (e.g. 401-403 in FIG. 4) when the bit voltage $V_{BL}$ is maintained is less than the maintaining periods (e.g. 301-303 in FIG. 3) when the bit voltage $V_{BL}$ is maintained. In another embodiment, the difference between the levels VS1 and VS2 shown in FIG. 4 may be less than the difference between the levels VF1 and VF2 shown in FIG. 3. In other embodiments, the pre-determined value $I_{M2}$ shown in FIG. 4 may be less than the pre-determined value $I_{M1}$ shown in FIG. 3. Additionally, the level VS1 shown in FIG. 4 may be equal to the level VF1 shown in FIG. 3.

Figure 5:
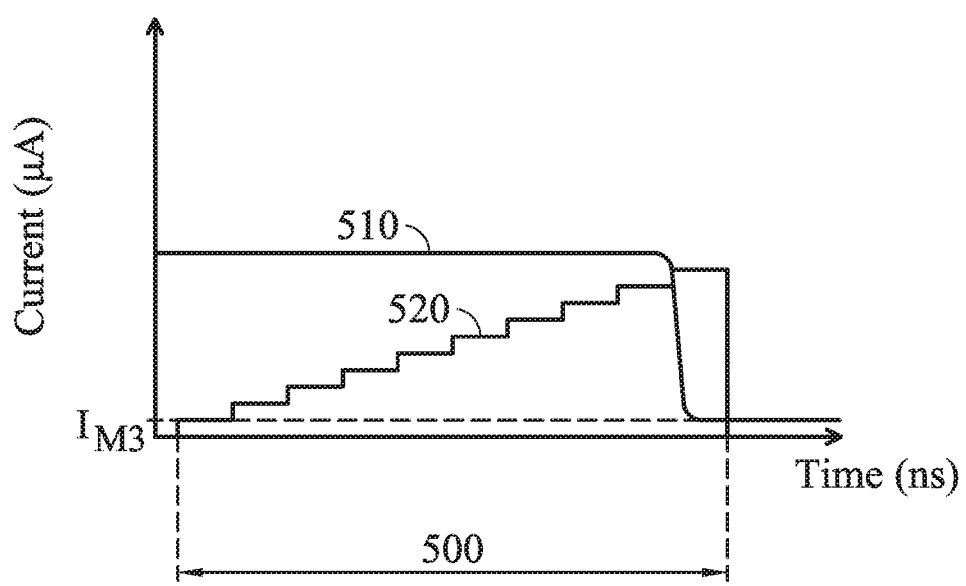
FIG. 5 is a schematic diagram illustrating the relationship between a source voltage and the current flowing through a variable resistor when the specific period is a reset period.

FIG. 5 is a schematic diagram illustrating the relationship between the source voltage $V_{SL}$ and the current flowing through the variable resistor 220 when the specific period is the reset period. The curve 510 represents the current flowing through the variable resistor 220. The curve 520 represents the level of the source voltage $V_{SL}$. The testing machine 110 maintains the level of the bit voltage $V_{BL}$ and gradually increases the source voltage $V_{SL}$ of the source line $SL_1$ in the reset period 500 such that the state of the variable resistor 220 is changed from the LRS to the HRS. At this time, the testing machine 110 provides a reset voltage to serve as the word voltage $V_{WL}$.

In this embodiment, the testing machine 110 provides the source voltage $V_{SL}$ to the storage cell. The testing machine 110 maintains the level of the source voltage $V_{SL}$ and measures the current flowing through the variable resistor 220. When the current flowing through the variable resistor 220 does not arrive at a pre-determined value $I_{M3}$, the testing machine 110 increases the level of the source voltage $V_{SL}$ until the current flowing through the variable resistor 220 arrives at the pre-determined value $I_{M3}$.

The invention does not limit when the testing machine 110 gradually increases the corresponding voltage. For example, the testing machine 110 gradually increases the bit voltage $V_{BL}$ or the source voltage $V_{SL}$ in at least one of the forming period, the reset period, and the set period. In one embodiment, the testing machine 110 gradually increases the bit voltage $V_{BL}$ only in the forming period. In this case, the testing machine 110 does not gradually increase the bit voltage $V_{BL}$ or the source voltage $V_{SL}$ in the reset period and the set period.

In another embodiment, the testing machine 110 gradually increases the bit voltage $V_{BL}$ in the forming period and the set period. In this case, the durations of the maintaining periods (e.g. 301-303) in the forming period may be longer than the durations of the maintaining periods (e.g. 401-403) in the set period. Additionally, the increased degree of the bit voltage $V_{BL}$ in the forming period may be greater than the increased degree of the bit voltage $V_{BL}$ in the set period.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A measurement system, comprising:
a testing machine providing a row address, a column address, a word voltage, a bit voltage, and a source voltage; and
a resistive memory comprising:
a row controller coupled to a plurality of word lines and transmitting the word voltage to a first word line among the word lines according to the row address;
a column controller coupled to a plurality of bit lines and transmitting the bit voltage to a first bit line among the bit lines according to the column address; and
a first storage cell comprising at least one transistor and at least one variable resistor, wherein a gate of the transistor is coupled to the first word line, a source of the transistor is coupled to a source line, the variable resistor is couple between the first bit line and a drain of the transistor, and the source line receives the source voltage,
wherein in a specific period, the testing machine provides a write voltage to change a state of the variable resistor, the testing machine maintains the level of the write voltage and measures a current flowing through the variable resistor in a maintaining period, and when the current flowing through the variable resistor does not arrive at a pre-determined value, the testing machine increases the write voltage.

2. The measurement system as claimed in claim 1, wherein the specific period is a forming period, and the write voltage serves as the bit voltage to set the state of the variable resistor at a low resistance state.

3. The measurement system as claimed in claim 1, wherein the specific period is a reset period, and the write voltage serves as the source voltage to change the state of the variable resistor from a low resistance state to a high resistance state.

4. The measurement system as claimed in claim 1, wherein the specific period is a set period, and the write voltage serves as the bit voltage to change the state of the variable resistor from a high resistance state to a low resistance state.

5. The measurement system as claimed in claim 1, wherein the specific period comprises a forming period and a set period,
in the forming period, the testing machine provides a first bit voltage to change the state of the variable resistor, the testing machine maintains the first bit voltage to measure the current flowing through the variable resistor in a first maintaining period, when the current flowing through the variable resistor does not arrive at a first pre-determined value, the testing machine increases the first bit voltage, and
in the set period, the testing machine provides a second bit voltage to change the state of the variable resistor, the testing machine maintains the second bit voltage to measure the current flowing through the variable resistor, in a second maintaining period, when the current flowing through the variable resistor does not arrive at a second pre-determined value, the testing machine increases the second bit voltage.

6. The measurement system as claimed in claim 1, wherein the testing machine continuously increases the write voltage until the current flowing through the variable resistor arrives at the pre-determined value.

7. The measurement system as claimed in claim 1, wherein in the specific period, the testing machine maintains the level of the word voltage.

8. The measurement system as claimed in claim 1, wherein in the maintaining period, the testing machine maintains the level of the write voltage at a first level, when the current flowing through the variable resistor does not arrive at the pre-determined value, the testing machine increases the level of the write voltage from the first level to a second level, maintains the level of the write voltage at the second level, and measures the current flowing through the variable resistor,
when the current flowing through the variable resistor has not arrived at the pre-determined value yet, the testing machine increases the level of the write voltage from the second level to a third level, and the difference between the first and second levels is the same as the difference between the second and third levels.

9. The measurement system as claimed in claim 1, wherein the testing machine stepwise adjusts the level of the write voltage.

10. A resistive memory receiving a row address, a column address, a word voltage, a bit voltage, and a source voltage, comprising:
a row controller coupled to a plurality of word lines and transmitting the word voltage to a first word line among the word lines according to the row address;
a column controller coupled to a plurality of bit line and transmitting the bit voltage to a first bit line among the bit lines according to the column address; and
a first storage cell comprising at least one transistor and at least one variable resistor, wherein a gate of the transistor is coupled to the first word line, a source of the transistor is coupled to a source line, the variable resistor is coupled between the first bit line and a drain of the transistor, and the source line receives the source voltage;
wherein in a specific period, the resistive memory receives a write voltage to change a state of the variable resistor, a level of the write voltage is maintained in a maintaining period, and when a current flowing through the variable resistor does not arrive at a pre-determined value, the level of the write voltage received by the resistive memory is increased.

* * * * *